(12) United States Patent
Lung

(10) Patent No.: US 7,894,254 B2
(45) Date of Patent: Feb. 22, 2011

(54) REFRESH CIRCUITRY FOR PHASE CHANGE MEMORY

(75) Inventor: Hsiang-Lan Lung, Dobbs Ferry, NY (US)

(73) Assignee: Macronix International Co., Ltd., Hsinchu (TW)

( * ) Notice: Subject to any disclaimer, the term of this patent is extended or adjusted under 35 U.S.C. 154(b) by 34 days.

(21) Appl. No.: 12/503,566

(22) Filed: Jul. 15, 2009

(65) Prior Publication Data

US 2011/0013446 A1    Jan. 20, 2011

(51) Int. Cl.
*G11C 11/00* (2006.01)

(52) U.S. Cl. .................. 365/163; 365/148; 365/222

(58) Field of Classification Search .................. 365/163, 365/148, 222, 205, 230.06
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 3,846,767 A | 11/1974 | Cohen | |
| 4,452,592 A | 6/1984 | Tsai | |
| 4,599,705 A | 7/1986 | Holmberg et al. | |
| 4,719,594 A | 1/1988 | Young et al. | |
| 4,769,339 A | 9/1988 | Ishii et al. | |
| 4,876,220 A | 10/1989 | Mohsen et al. | |
| 4,959,812 A | 9/1990 | Momodomi et al. | |
| 5,106,775 A | 4/1992 | Kaga et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,332,923 A | 7/1994 | Takeuchi et al. | |
| 5,391,901 A | 2/1995 | Tanabe et al. | |
| 5,515,488 A | 5/1996 | Hoppe et al. | |
| 5,534,712 A | 7/1996 | Ovshinsky et al. | |
| 5,550,396 A | 8/1996 | Tsutsumi et al. | |

(Continued)

FOREIGN PATENT DOCUMENTS

WO    2004025659 A1    3/2004

OTHER PUBLICATIONS

Strauss, Karl F. et al., "Overview of Radiation Tolerant Unlimited Write Cycle Non-Volatile Memory," IEEE Mar. 18-25, 2000, pp. 399-408.

(Continued)

*Primary Examiner*—Gene N. Auduong
(74) *Attorney, Agent, or Firm*—Haynes Beffel & Wolfeld LLP

(57) ABSTRACT

A memory device as described herein includes a reference array of phase change memory cells and a memory array of phase change memory cells, where a difference between a current data set stored in the reference array and an expected data set is used to determine when to refresh the memory array. The high resistance state for the reference array is a "partial reset" state having a minimum resistance less than that of the high resistance state for the memory array. Sense circuitry is adapted to read the memory cells of the reference array and to generate a refresh command signal if there is a difference between a current data set stored in the reference array and an expected data set, and control circuitry responsive to the refresh command signal to perform a refresh operation on the memory cells of the memory array.

20 Claims, 8 Drawing Sheets

U.S. PATENT DOCUMENTS

| | | | |
|---|---|---|---|
| 5,687,112 A | 11/1997 | Ovshinsky |
| 5,688,713 A | 11/1997 | Linliu et al. |
| 5,716,883 A | 2/1998 | Tseng et al. |
| 5,754,472 A | 5/1998 | Sim et al. |
| 5,768,193 A | 6/1998 | Lee et al. |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji et al. |
| 6,066,870 A | 5/2000 | Siek |
| 6,075,719 A | 6/2000 | Lowrey et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,337,266 B1 | 1/2002 | Zahorik |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,438,056 B2 | 8/2002 | Aue |
| 6,440,837 B1 | 8/2002 | Harshfield |
| 6,462,353 B1 | 10/2002 | Gilgen |
| 6,483,736 B2 | 11/2002 | Johnson et al. |
| 6,487,106 B1 | 11/2002 | Kozicki |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,512,263 B1 | 1/2003 | Yuan et al. |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung |
| 6,586,761 B2 | 7/2003 | Lowrey |
| 6,587,378 B2 | 7/2003 | Hassan et al. |
| 6,589,714 B2 | 7/2003 | Maimon et al. |
| 6,593,176 B2 | 7/2003 | Dennison |
| 6,596,589 B2 | 7/2003 | Tseng |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,677,678 B2 | 1/2004 | Biolsi et al. |
| 6,744,088 B1 | 6/2004 | Dennison |
| 6,750,079 B2 | 6/2004 | Lowrey et al. |
| 6,750,101 B2 | 6/2004 | Lung et al. |
| 6,768,665 B2 | 7/2004 | Parkinson et al. |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,815,704 B1 | 11/2004 | Chen |
| 6,838,692 B1 | 1/2005 | Lung et al. |
| 6,850,432 B2 | 2/2005 | Lu et al. |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg et al. |
| 6,992,932 B2 | 1/2006 | Cohen |
| 6,998,289 B2 | 2/2006 | Hudgens et al. |
| 7,023,008 B1 | 4/2006 | Happ |
| 7,023,009 B2 | 4/2006 | Kostylev et al. |
| 7,033,856 B2 | 4/2006 | Lung et al. |
| 7,038,230 B2 | 5/2006 | Chen et al. |
| 7,038,938 B2 | 5/2006 | Kang et al. |
| 7,042,001 B2 | 5/2006 | Kim et al. |
| 7,042,760 B2 | 5/2006 | Hwang et al. |
| 7,054,183 B2 | 5/2006 | Rinerson et al. |

| | | | | | |
|---|---|---|---|---|---|
| 7,067,837 B2 | 6/2006 | Hwang et al. | 2002/0113273 A1 | 8/2002 | Hwang et al. |
| 7,067,864 B2 | 6/2006 | Nishida et al. | 2002/0168852 A1 | 11/2002 | Harshfield et al. |
| 7,067,865 B2 | 6/2006 | Lung et al. | 2003/0072195 A1 | 4/2003 | Mikolajick |
| 7,078,273 B2 | 7/2006 | Matsuoka et al. | 2003/0095426 A1 | 5/2003 | Hush et al. |
| 7,085,154 B2 | 8/2006 | Cho et al. | 2003/0116794 A1 | 6/2003 | Lowrey |
| 7,099,180 B1 | 8/2006 | Dodge et al. | 2003/0186481 A1 | 10/2003 | Lung |
| 7,115,927 B2 | 10/2006 | Hideki et al. | 2004/0026686 A1 | 2/2004 | Lung |
| 7,122,281 B2 | 10/2006 | Pierrat | 2004/0051094 A1 | 3/2004 | Ooishi |
| 7,122,824 B2 | 10/2006 | Khouri et al. | 2004/0113137 A1 | 6/2004 | Lowrey |
| 7,126,149 B2 | 10/2006 | Iwasaki et al. | 2004/0165422 A1 | 8/2004 | Hideki et al. |
| 7,126,847 B2 | 10/2006 | Ha et al. | 2004/0248339 A1 | 12/2004 | Lung |
| 7,132,675 B2 | 11/2006 | Gilton | 2004/0256610 A1 | 12/2004 | Lung |
| 7,151,273 B2 | 12/2006 | Campbell et al. | 2005/0018526 A1 | 1/2005 | Lee |
| 7,154,774 B2 | 12/2006 | Bedeschi et al. | 2005/0029502 A1 | 2/2005 | Hudgens |
| 7,158,411 B2 | 1/2007 | Yeh et al. | 2005/0052904 A1 | 3/2005 | Cho et al. |
| 7,164,147 B2 | 1/2007 | Lee et al. | 2005/0062087 A1 | 3/2005 | Chen et al. |
| 7,166,533 B2 | 1/2007 | Happ | 2005/0093022 A1 | 5/2005 | Lung |
| 7,169,635 B2 | 1/2007 | Kozicki | 2005/0127349 A1 | 6/2005 | Horak et al. |
| 7,190,607 B2 | 3/2007 | Cho et al. | 2005/0141261 A1 | 6/2005 | Ahn |
| 7,202,493 B2 | 4/2007 | Lung et al. | 2005/0145984 A1 | 7/2005 | Chen et al. |
| 7,208,751 B2 | 4/2007 | Ooishi et al. | 2005/0167656 A1 | 8/2005 | Sun et al. |
| 7,214,958 B2 | 5/2007 | Happ | 2005/0191804 A1 | 9/2005 | Lai et al. |
| 7,220,983 B2 | 5/2007 | Lung | 2005/0195633 A1 | 9/2005 | Choi et al. |
| 7,229,883 B2 | 6/2007 | Wang et al. | 2005/0201182 A1 | 9/2005 | Osada et al. |
| 7,238,959 B2 | 7/2007 | Chen | 2005/0212024 A1 | 9/2005 | Happ |
| 7,238,994 B2 | 7/2007 | Chen et al. | 2005/0212026 A1 | 9/2005 | Chung et al. |
| 7,248,494 B2 | 7/2007 | Oh et al. | 2005/0215009 A1 | 9/2005 | Cho |
| 7,251,157 B2 | 7/2007 | Osada et al. | 2005/0263829 A1 | 12/2005 | Song et al. |
| 7,253,429 B2 | 8/2007 | Klersy et al. | 2006/0006472 A1 | 1/2006 | Jiang |
| 7,254,059 B2 | 8/2007 | Li et al. | 2006/0018156 A1 | 1/2006 | Happ |
| 7,262,502 B2 | 8/2007 | Chang | 2006/0034112 A1 | 2/2006 | Oh et al. |
| 7,269,052 B2 | 9/2007 | Segal et al. | 2006/0038221 A1 | 2/2006 | Lee et al. |
| 7,277,317 B2 | 10/2007 | Le Phan | 2006/0066156 A1 | 3/2006 | Dong et al. |
| 7,286,409 B1 | 10/2007 | Chen | 2006/0073642 A1 | 4/2006 | Yeh et al. |
| 7,291,556 B2 | 11/2007 | Choi et al. | 2006/0091476 A1 | 5/2006 | Pinnow et al. |
| 7,309,630 B2 | 12/2007 | Fan et al. | 2006/0094154 A1 | 5/2006 | Lung |
| 7,314,776 B2 | 1/2008 | Johnson et al. | 2006/0108667 A1 | 5/2006 | Lung |
| 7,317,201 B2 | 1/2008 | Gutsche et al. | 2006/0110878 A1 | 5/2006 | Lung et al. |
| 7,321,130 B2 | 1/2008 | Lung et al. | 2006/0110888 A1 | 5/2006 | Cho et al. |
| 7,323,708 B2 | 1/2008 | Lee et al. | 2006/0113520 A1 | 6/2006 | Yamamoto et al. |
| 7,323,734 B2 | 1/2008 | Ha et al. | 2006/0113521 A1 | 6/2006 | Lung |
| 7,332,370 B2 | 2/2008 | Chang et al. | 2006/0118913 A1 | 6/2006 | Yi et al. |
| 7,336,526 B2 | 2/2008 | Osada et al. | 2006/0124916 A1 | 6/2006 | Lung |
| 7,351,648 B2 | 4/2008 | Furukawa et al. | 2006/0126395 A1 | 6/2006 | Chen et al. |
| 7,359,231 B2 | 4/2008 | Venkataraman et al. | 2006/0131555 A1 | 6/2006 | Liu et al. |
| 7,364,935 B2 | 4/2008 | Lung et al. | 2006/0138467 A1 | 6/2006 | Lung |
| 7,365,385 B2 | 4/2008 | Abbott | 2006/0154185 A1 | 7/2006 | Ho et al. |
| 7,379,328 B2 | 5/2008 | Osada et al. | 2006/0157680 A1 | 7/2006 | Takaura et al. |
| 7,385,235 B2 | 6/2008 | Lung et al. | 2006/0157681 A1 | 7/2006 | Chen et al. |
| 7,388,273 B2 | 6/2008 | Burr et al. | 2006/0158948 A1 | 7/2006 | Fuji |
| 7,394,088 B2 | 7/2008 | Lung | 2006/0163554 A1 | 7/2006 | Lankhorst et al. |
| 7,397,060 B2 | 7/2008 | Lung | 2006/0169968 A1 | 8/2006 | Happ |
| 7,400,522 B2 | 7/2008 | Toda et al. | 2006/0172067 A1 | 8/2006 | Ovshinsky et al. |
| 7,423,300 B2 | 9/2008 | Lung et al. | 2006/0175599 A1 | 8/2006 | Happ |
| 7,426,134 B2 | 9/2008 | Happ et al. | 2006/0192193 A1 | 8/2006 | Lee et al. |
| 7,440,308 B2 | 10/2008 | Jeong et al. | 2006/0198183 A1 | 9/2006 | Kawahara et al. |
| 7,449,710 B2 | 11/2008 | Lung | 2006/0202245 A1 | 9/2006 | Zuliani et al. |
| 7,473,576 B2 | 1/2009 | Lung | 2006/0205108 A1 | 9/2006 | Maimon et al. |
| 7,479,649 B2 | 1/2009 | Lung | 2006/0211165 A1 | 9/2006 | Hwang et al. |
| 7,485,891 B2 | 2/2009 | Hamann et al. | 2006/0226409 A1 | 10/2006 | Burr et al. |
| 7,502,252 B2 | 3/2009 | Fuji et al. | 2006/0234138 A1 | 10/2006 | Fehlhaber et al. |
| 7,505,330 B2 | 3/2009 | Pawlowski et al. | 2006/0237756 A1 | 10/2006 | Park et al. |
| 7,507,986 B2 | 3/2009 | Lung | 2006/0245236 A1 | 11/2006 | Zaidi |
| 7,514,334 B2 | 4/2009 | Chen et al. | 2006/0250885 A1 | 11/2006 | Cho et al. |
| 7,514,705 B2 | 4/2009 | Breitwisch et al. | 2006/0261392 A1 | 11/2006 | Lee et al. |
| 7,515,461 B2 | 4/2009 | Happ et al. | 2006/0266993 A1 | 11/2006 | Suh et al. |
| 7,539,050 B2 * | 5/2009 | Philipp et al. ............... 365/163 | 2006/0284157 A1 | 12/2006 | Chen et al. |
| 7,569,844 B2 | 8/2009 | Lung | 2006/0284158 A1 | 12/2006 | Lung et al. |
| 7,580,277 B2 * | 8/2009 | Fuji .......................... 365/148 | 2006/0284214 A1 | 12/2006 | Chen |
| 7,751,227 B2 * | 7/2010 | Fuji .......................... 365/148 | 2006/0284279 A1 | 12/2006 | Lung et al. |
| 7,796,424 B2 * | 9/2010 | Happ et al. ................. 365/163 | 2006/0286709 A1 | 12/2006 | Lung et al. |
| 2002/0017701 A1 | 2/2002 | Klersy et al. | 2006/0286743 A1 | 12/2006 | Lung et al. |
| 2002/0070457 A1 | 6/2002 | Sun et al. | 2006/0289847 A1 | 12/2006 | Dodge |

| | | |
|---|---|---|
| 2006/0289848 A1 | 12/2006 | Dennison |
| 2007/0007613 A1 | 1/2007 | Wang et al. |
| 2007/0008786 A1 | 1/2007 | Scheuerlein |
| 2007/0030721 A1 | 2/2007 | Segal et al. |
| 2007/0037101 A1 | 2/2007 | Morioka |
| 2007/0040159 A1 | 2/2007 | Wang |
| 2007/0051936 A1 | 3/2007 | Pellizzer et al. |
| 2007/0083790 A1 | 4/2007 | Nurmi et al. |
| 2007/0096162 A1 | 5/2007 | Happ et al. |
| 2007/0096248 A1 | 5/2007 | Philipp et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0120104 A1 | 5/2007 | Ahn et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0138458 A1 | 6/2007 | Lung |
| 2007/0140029 A1 | 6/2007 | Kim et al. |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0156949 A1 | 7/2007 | Rudelic et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0170881 A1 | 7/2007 | Noh et al. |
| 2007/0171762 A1 | 7/2007 | Chen et al. |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0252127 A1 | 11/2007 | Arnold et al. |
| 2007/0257300 A1 | 11/2007 | Ho et al. |
| 2007/0262388 A1 | 11/2007 | Ho et al. |
| 2007/0267618 A1 | 11/2007 | Zaidi et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025079 A1 | 1/2008 | Philipp et al. |
| 2008/0025089 A1 | 1/2008 | Scheuerlein et al. |
| 2008/0043520 A1 | 2/2008 | Chen |
| 2008/0094871 A1 | 4/2008 | Parkinson |
| 2008/0101110 A1 | 5/2008 | Happ et al. |
| 2008/0106923 A1 | 5/2008 | Lung |
| 2008/0117704 A1 | 5/2008 | Happ et al. |
| 2008/0137400 A1 | 6/2008 | Chen et al. |
| 2008/0138929 A1 | 6/2008 | Lung |
| 2008/0138930 A1 | 6/2008 | Lung |
| 2008/0138931 A1 | 6/2008 | Lung |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |
| 2008/0170431 A1 | 7/2008 | Sheu et al. |
| 2008/0179582 A1 | 7/2008 | Burr et al. |
| 2008/0180990 A1 | 7/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0224119 A1 | 9/2008 | Burr et al. |
| 2008/0225489 A1 | 9/2008 | Cai et al. |
| 2008/0265234 A1 | 10/2008 | Breitwisch et al. |
| 2008/0266933 A1 | 10/2008 | Chen et al. |
| 2008/0303014 A1 | 12/2008 | Goux et al. |
| 2008/0310208 A1 | 12/2008 | Daley |
| 2009/0001341 A1 | 1/2009 | Breitwisch et al. |
| 2009/0014704 A1 | 1/2009 | Chen et al. |
| 2009/0023242 A1 | 1/2009 | Lung |
| 2009/0027950 A1 | 1/2009 | Lam et al. |
| 2009/0042335 A1 | 2/2009 | Lung |
| 2009/0057641 A1 | 3/2009 | Lung |
| 2009/0072215 A1 | 3/2009 | Lung et al. |
| 2009/0098678 A1 | 4/2009 | Lung |
| 2009/0166603 A1 | 7/2009 | Lung |
| 2009/0268507 A1 | 10/2009 | Breitwisch et al. |
| 2009/0273968 A1 | 11/2009 | Lamorey et al. |
| 2009/0289242 A1 | 11/2009 | Breitwisch et al. |
| 2009/0294748 A1 | 12/2009 | Breitwisch et al. |

OTHER PUBLICATIONS

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/ richcontent/ MAPLDCon99/Papers/P21_Tyson_P.
PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era- vol. 4, pp. 674-679, 2004.

Wuttig, Matthias, "Towards a University Memory?" Nature Materials, Apr. 2005, pp. 265-266, vol. 4.

Yamada, Noboru, "Potential of Ge-Sb-Te phase-change optical disks for high-data-rate recording in the near future," (Conference Proceedings Paper), Jul. 30, 1997, vol. 3109, 10 pages.

Yi, J. H. et al., "Novel Cell Structure of PRAM with Thin Metal Layer Inserted GeSbTe," IEEE IEDM Dec. 10, 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

"Magnetic Bit Boost," www.sciencenews.org, Dec. 18 & 25, 2004, p. 389, vol. 166.

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "A Highly Manufacturable High Density Phase Change Memory of 64 Mb and Beyond," IEEE IEDM Dec. 13-15, 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Atwood, G, et al., "90 nm Phase Change Technology with u Trench and Lance Cell Elements," VLSI Technology, Systems and Applications, Apr. 23-25, 2007, pp. 1-2.

Axon Technologies Corporation paper: Technology Description, published at least as early as Dec. 1997, pp. 1-6.

Bedeschi, F. et al., "4-MB MOSFET-Selected Phase-Change Memory Experimental Chip," IEEE, Sep. 21 to 23, 2004, 4 PP.

Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen, an et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb,"Jun. 14-16, 2005 Symposium on VLSI Technology Digest of Technical Papers, pp. 96-97.

Gibson, G. A. et al., "Phase-change Recording Medium that Enables Ultrahigh-density Electron-beam Data Storage, " Applied Physics Letter, 2005, 3 pp., vol. 86.

Gilbert, N. E., "A macro model of programmable metallization cell devices," Solid-State Electronics 49 (2005) 1813-1819.

Gill, Manzur et al., "A High-Performance Nonvolatile Memory Technology for Stand-Alone Memory and Embedded Applications," Feb. 3-7, 2002 IEEE-ISSCC Technical Digest (TD 12.4), 7 pp.

Gleixner, "Phase Change Memory Reliability", 22nd NVSMW, Aug. 26, 2007, 46 pages.

Ha, Y. H. et al., "An Edge Contact Type Cell for Phase Change RAM Featuring Very Low Power Consumption," Jun. 10-12, 2003 Symposium on VLSI Technology Digest of Technical Papers, pp. 175-176.

Hanzawa, Satoru, et al., "A 512kB Embedded Phase Change Memory with 416kB/s Write Throughput at 100mA Cell Write Current," ISSCC 2007, Session 26, Non-Volatile Memories/26.2, 3 pages.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," Jun. 10-12, 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24um-CMOS Technologies," Jun. 10-12, 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, Apr. 17-21, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM Dec. 13-15, 2004, 4 pp.

Lai, Stefan, "Current Status of the Phase Change Memory and Its Future," IEEE IEDM Dec. 10, 2003, pp. 255-258.

Lai, Stephan et al., "OUM-A 180 nm Nonvolatile Memory Cell Element Technology for Stand Alone and Embedded Applications," IEEE IEDM Dec. 2-5, 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Lee, J.I., et al., "Highly Scalable Phase Change Memory with CVD GeSbTe for Sub 50nm Genreation," 2007 Symp on VLSI Tech. Digest of Technical Papers, pp. 102-103.

Li, Yiming, "Temperature dependence on the contact size of GeSbTe films for phase change memories," J. Comput Electron (2008) 7:138-141.

Mott, Nevill, "Electrons in Glass," Nobel Lecture, Dec. 8, 1977, Physics, 1977, pp. 403-413.

Oh, Hyung-Rok, et al., "Enhanced Write Performance of a 64Mb Phase-Change Random Access Memory," ISSCC 2005, Session 2, Non-Volatile Memory, 2.3, 3 pages.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase -Change Memory Cell for Embedded and Stand—Alone Non—Volatile Memory Applications," Jun. 15-17, 2004 Symposium on VLSI Technology Digest of Technical Papers, pp. 18-19.

Pirovano, Agostino et al.,"Reliability Study of Phase-Change Nonvolatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE Jun. 4-7, 2002, pp. 237-240.

Schaffet, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

* cited by examiner

REFRESH CIRCUITRY FOR PHASE CHANGE MEMORY

PARTIES TO A JOINT RESEARCH AGREEMENT

International Business Machines Corporation, a New York corporation, and Macronix International Corporation, Ltd., a Taiwan corporation, are parties to a Joint Research Agreement.

BACKGROUND OF THE INVENTION

1. Field of the Invention

The present invention relates to high density memory devices based on phase change based memory materials, including chalcogenide based materials and on other programmable resistive materials, and methods for refreshing such devices.

2. Description of Related Art

Phase change based memory materials, like chalcogenide based materials and similar materials, can be caused to change phase between amorphous and crystalline states by application of electrical current at levels suitable for implementation in integrated circuits. The generally amorphous state is characterized by higher electrical resistivity than the generally crystalline state, which can be readily sensed to indicate data. These properties have generated interest in using programmable resistive material to form nonvolatile circuits, which can be read and written with random access.

The change from the amorphous to the crystalline state, referred to as set herein, is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process and allowing at least a portion of the phase change material to stabilize in the amorphous state.

It has been observed that some phase change memory cells in the reset state experience a decrease in resistance over time to below a threshold value used to distinguish between the reset and set states, resulting in data retention problems and bit errors for those memory cells. For example, a memory cell in which the active region has been reset to a generally amorphous state may over time develop a distribution of crystalline regions in the active region. If these crystalline regions connect to form a low resistance path through the active region, when the memory cell is read a lower resistance state will be detected and result in a data error. See, Gleixner, "Phase Change Memory Reliability", 22nd NVSMW, 2007.

One attempt at addressing the data retention problems caused by the decrease in resistance over time is to maintain a relatively large read margin between the set and reset states. However, a relatively large read margin typically requires a slow set operation and a high reset current in order to obtain the large difference in resistance between the set and reset states. The relatively slow set operation and high reset current limit the operational speed of the device, restricting the use of phase change based memory circuits as high speed memory.

Thus, integrated circuits employing phase change based memory circuits typically also include other types of memory circuits in order to fulfill the memory performance requirements for the various functions of the integrated circuit. These different types of memory circuits are embedded at various locations in the integrated circuit, and typically include SRAM and DRAM memory circuits in order to provide high access speed memory for the integrated circuit. However, integration of different types of memory circuits for the various memory applications in an integrated circuit can be difficult and result in highly complex designs.

It has also been proposed to address the data retention problems by periodically refreshing phase change memory cells to offset any change in resistance that may occur over time.

One approach is to periodically read the resistance of each memory cell in the array to determine when to selectively perform a refresh operation on that particular memory cell. See, U.S. Patent Application Publication No. US 2008/0117704 entitled "Resistive Memory Including Selective Refresh Operation" by Happ et al, and U.S. Pat. No. 6,768,665 entitled "Refreshing Memory Cells of a Phase Change Material Memory Device" by Parkinson et al.

Another approach is to perform a refresh operation when the phase change memory has been accessed a number of times larger than a predetermined number. See, U.S. Patent Application Publication No. US 2008/0170431 entitled "Driving Method and System for a Phase Change Memory" by Sheu et al.

Another approach is to apply stress to a dummy set of memory cells based on the number of read and write operations performed on a main array of memory cells, and detecting changes in the resistance of the dummy set to determine when to refresh the main array of memory cells. See, U.S. Patent Application No. 2006/0158948 entitled "Memory Device" by Fuji.

It is therefore desirable to provide phase change based memory devices and methods for operating such devices which address the data retention issues discussed above and result in improved data storage performance.

SUMMARY OF THE INVENTION

A memory device as described herein includes a reference array of phase change memory cells and a memory array of phase change memory cells, where a difference between a current data set stored in the reference array and an expected data set is used to determine when to refresh the memory array.

The memory device includes bias circuitry to establish low and high resistance states in the memory array and in the reference array. The high resistance state for the reference array is a "partial reset" state having a minimum resistance less than a minimum resistance of the high resistance state for the memory array.

The device further includes sense circuitry to read the reference array and to generate a refresh command signal if there is a difference between a current data set stored in the reference array and an expected data set, and control circuitry responsive to the refresh command signal to perform a refresh operation on the memory array.

As a result of the lower minimum resistance for the partial reset state for the reference array, the data retention performance of the reference array is worse than that of the memory array and is used as an early predictor of bit errors in the memory array and the need to perform refresh operation.

The reference array has a small number of memory cells compared to that of the memory array. In one example, the reference array may have on the order of 100 memory cells, while the memory array may have millions or billions of memory cells.

As a result of the relatively small number of memory cells in the reference array, the detection of bit errors in the data in the reference array can be carried out much more quickly than detecting bit errors directly in the memory array. Additionally, the complexity of control and sensing circuitry needed to detect the bit errors is greatly simplified.

Since the probability of a bit error occurring in any particular memory cell is preferably small, the reference array also provides a more relevant statistical predictor of possible bit errors in the memory array than can be achieved using a single reference cell.

Methods for operating memory devices comprising a memory array of phase change cells and a reference array of phase change cells are also disclosed herein.

Other aspects and advantages of the present invention can be seen on review of the drawings, the detailed description, and the claims which follow.

DETAILED DESCRIPTION

A detailed description of embodiments of the present invention is provided with reference to FIGS. 1 to 8A-8E.

Figure 1:
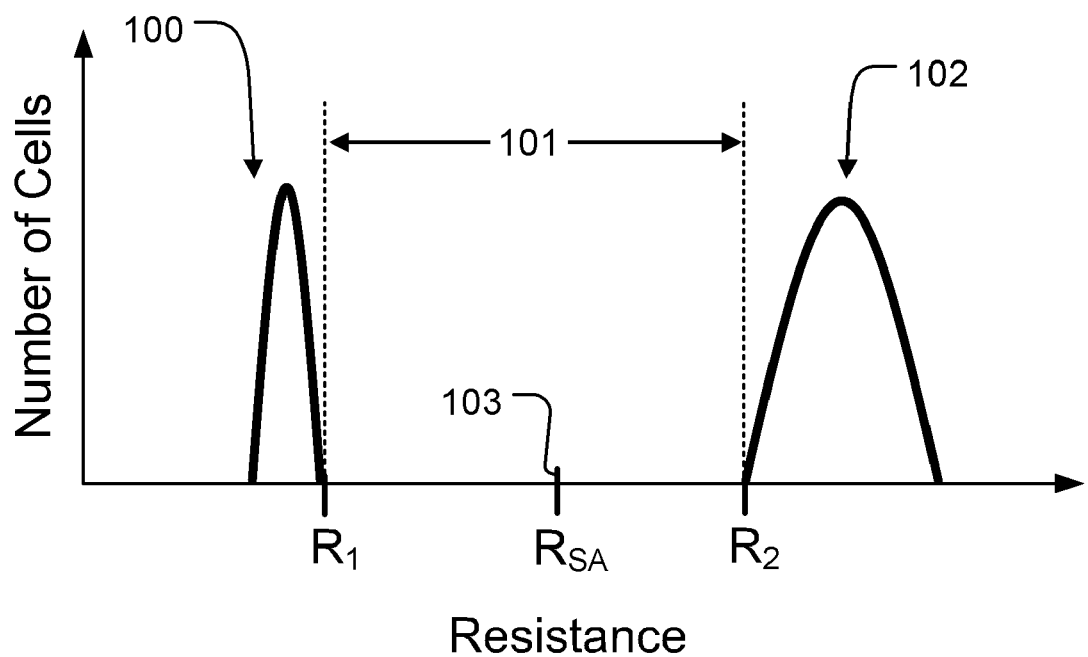
FIG. 1 is an example distribution of the resistance for a number of memory cells each comprising a phase change memory element having one of two states.

In phase change memory, data is stored by causing transitions in an active region of the phase change material between amorphous and crystalline phases. FIG. 1 is an example distribution of the resistance for a number of memory cells each comprising a phase change memory element having one of two states (storing a single bit of data). The phase change memory elements of the memory cells are programmable to a high resistance reset (erased) state 102 and a lower resistance set (programmed) state 100 (storing a single bit of data), each corresponding to a non-overlapping resistance range.

The change from the high resistance state 102 to the lower resistance state 100 is generally a lower current operation in which current heats the phase change material above a transition temperature to cause transition from the amorphous to the crystalline phase. The change from the lower resistance state 100 to the higher resistance state 102 is generally a higher current operation, which includes a short high current density pulse to melt or breakdown the crystalline structure, after which the phase change material cools quickly, quenching the phase change process and allowing at least a portion of the phase change material to stabilize in the amorphous phase.

The difference between the highest resistance R1 of the lower resistance state 100 and the lower resistance R2 of the high resistance reset state 102 defines a read margin 101 used to distinguish cells in the lower resistance state 100 from those in the high resistance state 102. The data stored in a memory cell can be determined by determining whether the memory cell has a resistance corresponding to the lower resistance state 100 or to the high resistance state 102, for example by measuring whether the resistance of the memory cell is above or below a threshold resistance value $R_{SA}$ 103 within the read margin 101.

In order to reliably distinguish between the reset state 102 and the set state 100, it is important to maintain a relatively large read margin 101. However, it has been observed that some phase change memory cells in the reset state 102 can experience an erratic "tailing bit" effect in which the resistance of the memory cell decreases over time to below the threshold resistance value $R_{SA}$ 103, resulting in data retention problems and bit errors for those memory cells. The rate of reduction in resistance depends upon a number of factors, including variations in structure across the array, manufacturing defects in the cells and environmental conditions to which the device is exposed.

Furthermore, in order to meet high speed memory requirements such as those typically required of DRAM and SRAM, phase change based memory circuits must operate at high set and reset operational speeds and use less operational current. These high set and reset speeds and low operational current reduce the difference in resistance between the states 100 and 102, which further increases the possibility of data retention problems and bit errors.

Figure 2:
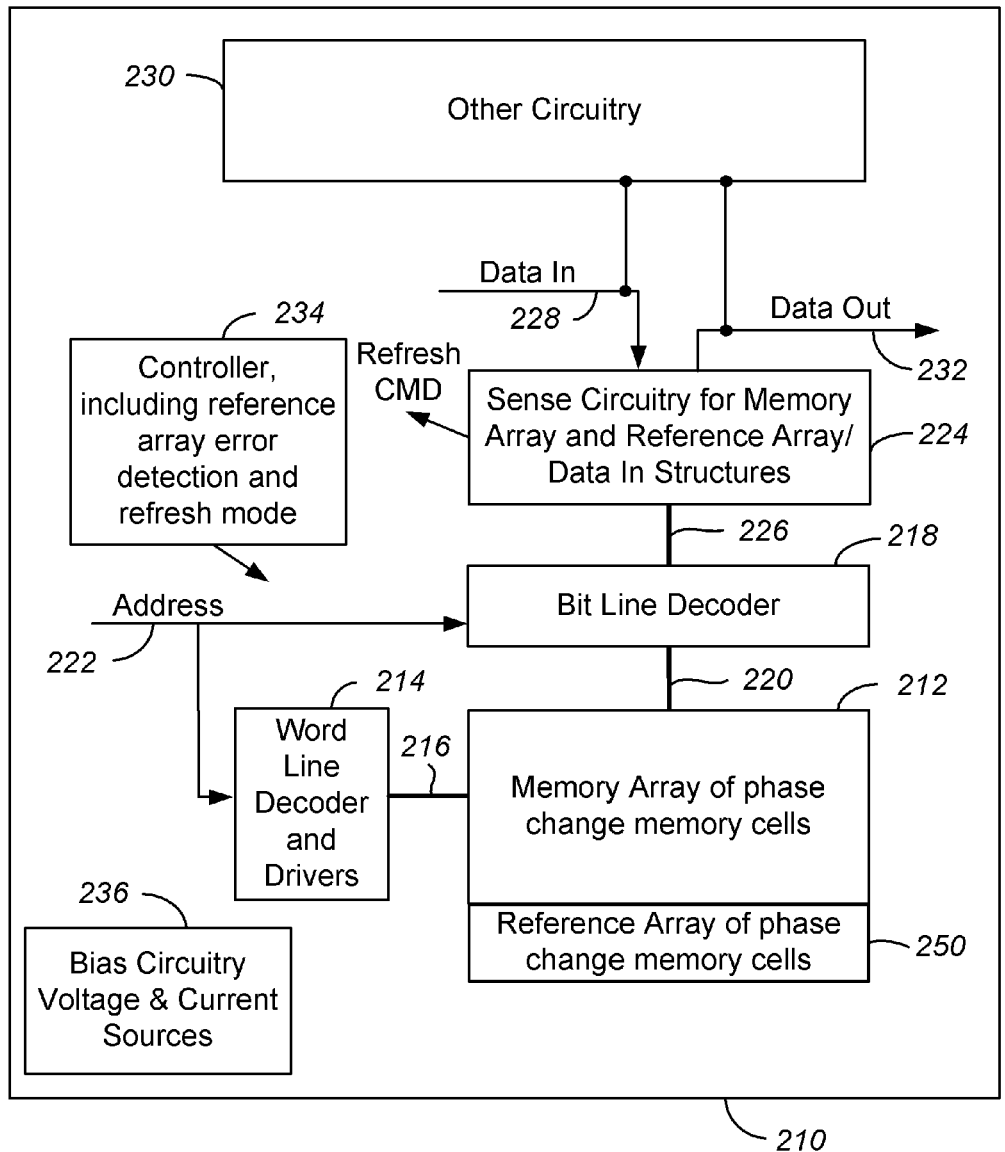
FIG. 2 is a block diagram of a first embodiment of an integrated circuit including a memory array of phase change memory cells and a reference array of phase change memory cells as described herein.

FIG. 2 is a block diagram of a first embodiment of an integrated circuit 210 including a memory array 212 of phase change memory cells and a reference array 250 of phase change memory cells. The memory cells of the arrays 212, 250 include an access device such as a diode or transistor, and a phase change memory element.

As described in more detail below, the integrated circuit 210 includes a controller 234 which controls the application of bias circuitry voltage & current sources 236 to establish low and high resistance states in the memory cells of the memory array 212 and in the memory cells of the reference array 250.

The high resistance state for the reference array 250 is a "partial reset" state having a minimum resistance less than that of the high resistance state for the memory array 212. As a result, over time the data retention performance of the reference array 250 is worse than that of the memory array 212, and bit errors in the reference array 250 can be used as an early predictor of bit errors in the memory array 212 and the need to perform a refresh operation. Thus, upon determination of a difference between a current data set stored in the reference array 250 and an expected data set, a refresh operation of the memory cells of the memory array 212 is performed.

The reference array 250 has a small number of memory cells compared to that of the memory array 212, and thus can be read much more quickly and easily. In one example, the reference array 212 may have 100 or more memory cells, while the memory array 212 may have millions or billions of memory cells. As a result of the relatively small number of memory cells in the reference array 212, the detection of bit errors in the data in the reference array 250 can be carried out much more quickly than attempting to detect bit errors directly in the memory array 212. Additionally, the complexity of control and sensing circuitry needed to detect the bit errors is greatly simplified.

Also, since the probability of a bit error occurring in any particular memory cell is preferably small, the memory cells in the reference array 250 provides a more relevant statistical predictor of possible bit errors in the memory array 212 than can be achieved using a single reference cell.

A word line decoder 214 is coupled to and in electrical communication with a plurality of word lines 216 arranged along rows in the memory array 212 and reference array 250. A bit line (column) decoder is in electrical communication with a plurality of bit lines 220 arranged along columns in the memory array 212 and reference array 250. Addresses are supplied on bus 222 to word line decoder and drivers 214 and bit line decoder 218. Sense circuitry and data-in structures in block 224, including sense amplifier circuitry for the memory array 212 and reference array 250, are coupled to bit line decoder 218 via data bus 226. Data is supplied via a data-in line 228 from input/output ports on integrated circuit, to data-in structures in block 224. Other circuitry 230 may be included on integrated circuit 210, such as a general purpose processor or special purpose application circuitry, or a combination of modules providing system-on-a-chip functionality supported by array 212. Data is supplied via a data-out line 232 from the sense amplifiers in block 224 to input/output ports on integrated circuit 210, or other data destinations internal or external to integrated circuit 210.

A controller 234, implemented in this example using a bias arrangement state machine, controls the application of bias circuitry voltage & current sources 236 to apply bias arrangements such as read, program, erase, erase verify, program verify, and refresh to the memory cells of the memory array 212 and the reference array 250. The characteristics of the signals sent from the controller 234 determine the array 212, 250 to be accessed as well as the operation to be performed. Controller 234 may be implemented using special-purpose logic circuitry as known in the art. In alternative embodiments, controller 234 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 234. As described in more detail below, the controller 234 implements a refresh mode to refresh the memory cells of the memory array 212 and reference array 250 in response to a refresh command from the reference array sense circuitry of block 224, the refresh command indicating a difference between a current data set stored in the reference array and an expected data set.

The memory array 212 and reference array 250 can be arranged in different units of the same array to share bit lines and/or word lines, for example different banks, blocks, or sections of the same array. Alternatively, the memory array 212 and the reference array can be implemented in physically separate arrays.

In operation each of the memory cells in the arrays 212, 250 store data represented by the resistance of the corresponding memory element. The data value may be determined, for example, by comparison of voltage or current on a bit line for a selected memory cell to that of a suitable reference current or voltage by sense amplifiers in sense circuitry 224.

Reading or writing to a memory cell of arrays 212, 250, therefore, can be achieved by applying bias arrangements to provide appropriate voltages and/or current pulses to word lines and bit lines so that current flows through the selected memory cell. The level and duration of the pulses applied is dependent upon the array 212, 250, and also the operation to be performed. The level and durations of the pulses applied can be determined empirically for each embodiment. The various modes of operation for the memory array 212 and reference array 250 are explained in more detail below.

Memory Array

Figure 3:
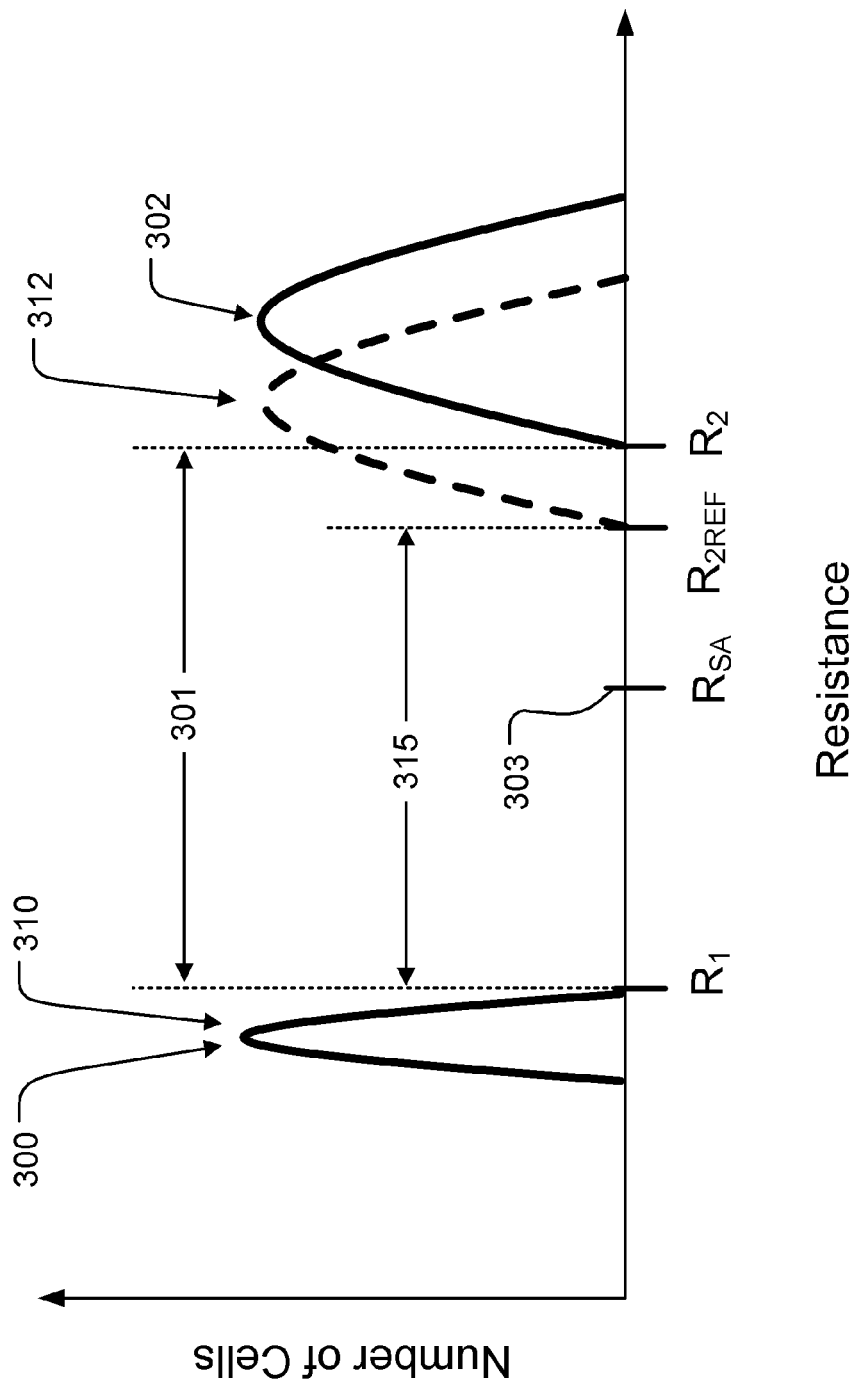
FIG. 3 is an example distribution of the resistance for a number of memory cells of the reference array and memory array, including partial reset for the reference array.

In biasing arrangements for a reset (erase) operation for a memory cell in the memory array 212, word line decoder 214 facilitates providing a word line with a suitable voltage pulse to turn on the access transistor of the memory cell. Bit line decoder 218 facilitates supplying a voltage pulse to a bit line of suitable amplitude and duration to induce a current to flow through the memory element, the current raising the temperature of the active region of the memory element above the transition temperature of the phase change material and also above the melting temperature to place the active region in a liquid state. The current is then terminated, for example by terminating the voltages on the bit line and word line, resulting in a relatively quick quenching time as the active region cools, thereby setting the phase change material to a resistance within a resistive value associated with the memory array higher resistance reset state 302 as shown in FIG. 3.

In biasing arrangements for a set (program) operation for a memory cell in the memory array 212, word line decoder 214 facilitates providing a word line with a suitable voltage pulse to turn on the access transistor of the memory cell. Bit line decoder 224 facilitates supplying a voltage pulse to a bit line of suitable amplitude and duration to induce a current to flow through the memory element, the current sufficient to raise the temperature of the active region above the transition temperature and cause a transition of at least a portion of the active region from the amorphous phase into the crystalline phase, this transition lowering the resistance of the memory element and setting the resistance of the phase change material within a resistive value range associated with the memory array lower resistance set state 300.

The difference between the highest resistance $R_1$ of the memory array lower resistance set state 300 and the lower resistance $R_2$ of the memory array higher resistance reset state 302 defines a memory array read margin 301 used to distinguish cells of the memory array 212 in the lower resistance set state 300 from those in the higher resistance reset state 302.

In a read operation for a memory cell in the memory array 212, word line decoder 214 facilitates providing a word line with a suitable voltage pulse to turn on the access transistor of the memory cell. Bit line decoder 218 facilitates supplying a voltage pulse to a bit line of suitable amplitude and duration to induce a current to flow through the memory element that does not result in the memory element undergoing a change in resistive state. The current on the bit line and through the memory cell is dependent upon the resistance of the memory element and thus the data value stored. Thus, the data value stored in the memory cell may be determined by detecting whether the resistance of the memory cell corresponds to the high resistance state 302 or low resistance state 300, for example by comparison of a voltage or current on the corresponding bit line with a suitable voltage or current corresponding to $R_{SA}$ by sense amplifiers of sense circuitry 212.

In a refresh mode of the memory array 212, the control circuitry in controller 234 executes a procedure described in more detail below.

Reference Array

The reference array 250 stores a predetermined data set consisting of the memory cells of the array 250 written to high and low resistance states 312 and 310. As can be seen in FIG. 3, the distribution 312 for the "partial reset" state 312 for the reference array 250 has a minimum resistance $R_{2REF}$ less than the minimum resistance $R_2$ of the distribution 302 for the reset, high resistance state for the memory array 212.

As discussed below, changes over time in the data set stored in the reference array 250 caused by bit errors in the memory cells of the reference array 250 are used to determine when to perform a refresh operation on both the memory array 212 and reference array 250.

The write mode to store the predetermined data set in the reference array 250 includes set and partial reset operations for the phase change memory cells. The predetermined data set stored in the reference array 250 in the illustrated embodiment is a checkerboard pattern of alternating high and low resistance states between adjacent memory cells in the reference array 250. Alternatively, other techniques can be used for the arrangement of high and low resistance states for the memory cells in the reference array 250 for the data set.

In biasing arrangements for a partial reset operation for a memory cell in the reference array 250, word line decoder 214 facilitates providing a word line with a suitable voltage pulse to turn on the access transistor of the memory cell. Bit line decoder 218 facilitates supplying a voltage pulse to a bit line of suitable amplitude and duration to induce a current to flow through the memory element, the current raising the temperature of the active region of the memory element above the transition temperature of the phase change material and also above the melting temperature to place the active region in a liquid state. The current is then terminated, for example by terminating the voltages on the bit line and word line, resulting in a relatively quick quenching time as the active region cools, thereby setting the phase change material to a resistance within a resistive value associated with the reference array higher resistance partial reset state 312 as shown in FIG. 3.

Resistances in the distribution 312 for the partial reset state for the memory cells in the reference array 250 are achieved by causing the active region of the phase change memory elements of the memory cells of the reference array 250 to have a different mixture of crystalline and amorphous phase material, and/or a smaller active region size, than the phase change memory elements of the memory cells of the memory array 212 in the reset state.

For example, in a reset operation of a memory cell in the memory array 212 a first reset pulse adapted to achieve the full reset state represented by the distribution 302 may be applied, and in a reset operation of a memory cell in the reference array 250 a second reset pulse adapted to achieve the partial reset state as represented by distribution 312 may be applied, the first and second reset pulses having different values for at least one of pulse width, pulse height and shape of the trailing edge of the pulse. To achieve the different distributions 302, 312 for the reset and partial reset states, the second reset pulse may have for example a smaller pulse width and/or a longer pulse tail to provide slower quenching time than that of the first reset pulse.

Alternatively, the reset pulses having the same pulse shapes may be applied to both the memory array 212 and reference array 250, and the different distributions 302 and 312 for the reset and partial reset states may be achieved by differences in the cell structures of the arrays 212, 250, such as providing features in the cells to obtain different amounts of current density and thus resulting in differences in resistance.

In biasing arrangements for a set (program) operation for a memory cell in the reference array 250, word line decoder 214 facilitates providing a word line with a suitable voltage pulse to turn on the access transistor of the memory cell. Bit line decoder 224 facilitates supplying a voltage pulse to a bit line of suitable amplitude and duration to induce a current to flow through the memory element, the current sufficient to raise the temperature of the active region above the transition temperature and cause a transition of at least a portion of the active region from the amorphous phase into the crystalline phase, this transition lowering the resistance of the memory element and setting the resistance of the phase change material within a resistive value range associated with the reference array lower resistance set state 310.

In the illustrated embodiment the reference array lower resistance set state 310 and the memory array lower resistance set state 300 correspond to the same resistive value range. Alternatively, the states 300 and 310 may correspond to different resistive value ranges.

The difference between the highest resistance $R_1$ of the reference array lower resistance set state 310 and the lower resistance $R_{2REF}$ of the reference array higher resistance reset state 312 defines a reference array read margin 315 used to distinguish cells of the reference array 250 in the lower resistance set state 310 from those in the higher resistance partial reset state 312.

In a read mode of the reference array 250 the resistance state of the memory cells are read, and bit errors due to changes in the resistance over time are used to determine when to perform a refresh operation on the memory array 212.

In a read operation for a memory cell in the reference array 250, word line decoder 214 facilitates providing a word line with a suitable voltage pulse to turn on the access transistor of the memory cell. Bit line decoder 218 facilitates supplying a voltage pulse to a bit line of suitable amplitude and duration to induce a current to flow through the memory element that does not result in the memory element undergoing a change in resistive state. The current on the bit line and through the memory cell is dependent upon the resistance of the memory element and thus the data value stored. Thus, the data value stored in the memory cell may be determined by detecting whether the resistance of the memory cell corresponds to the high resistance state 302 or low resistance state 300, for example by comparison of a voltage or current on the corresponding bit line with a suitable voltage or current corresponding to $R_{SA}$ by sense amplifiers of sense circuitry 212.

Figure 4:
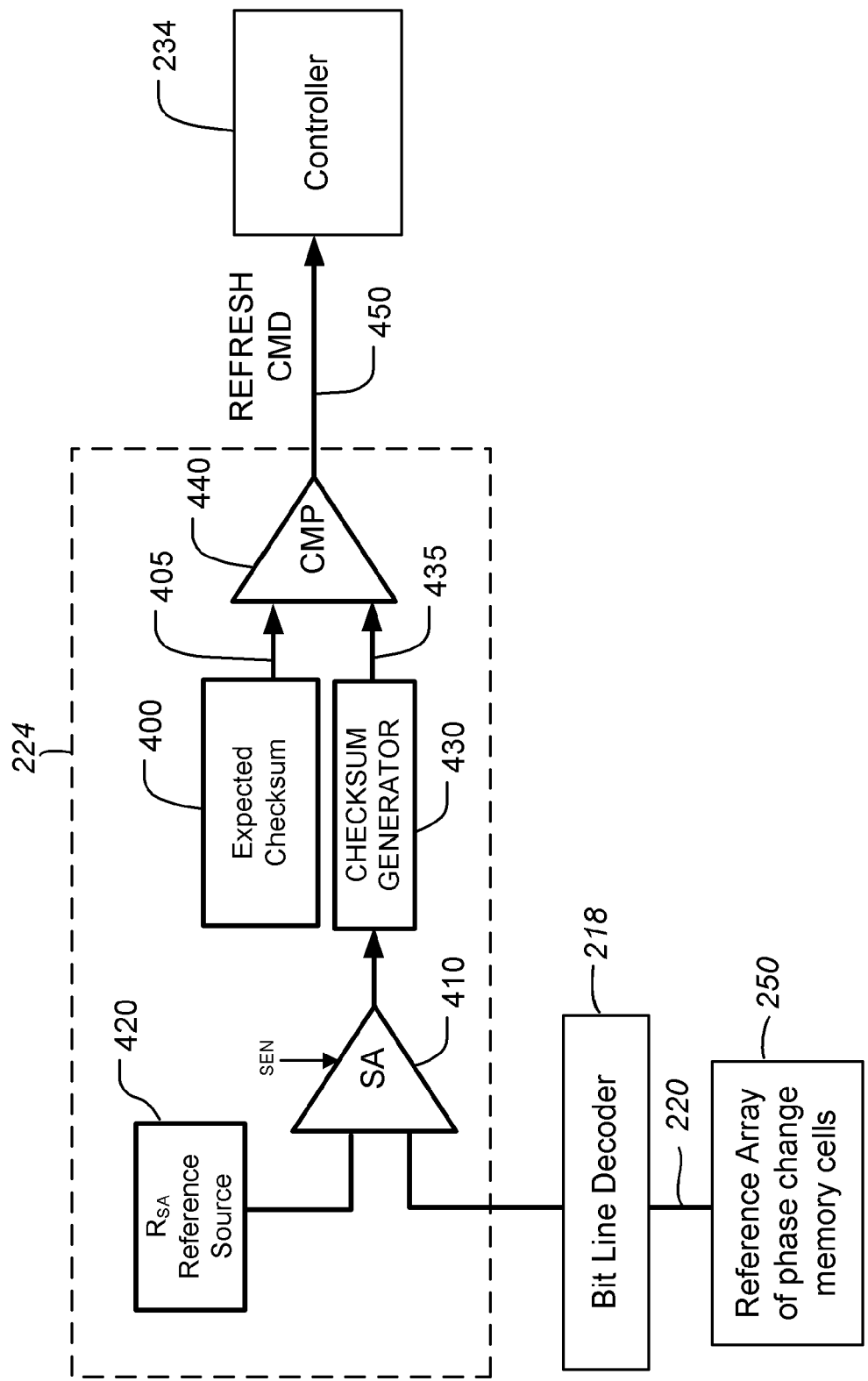
FIG. 4 illustrates an embodiment of sense circuitry for the integrated circuit which can be used to determine if the data set in the reference array is different from the expected data set, and if so to generate a refresh command signal which initiates the refresh operation process.

FIG. 4 illustrates an embodiment of sense circuitry 224 for the integrated circuit 210, which can be used to determine if the data set in the reference array 250 is different from the expected predetermined data set, and if so to generate a refresh command signal to the controller 234 which initiates the refresh operation process of the memory array 212 and reference array 250.

In FIG. 4 the reference array 250 is coupled by bit lines 220 through bit line decoder 218 to an input of sense amplifier 410. An $R_{SA}$ reference source 420 is coupled to the other input of the sense amplifier 410, and a sense enable signal SEN is coupled to the sense amplifier 410. During a read operation of a memory cell of the reference array 250, the sense amplifier 410 is responsive to the difference at its inputs to generate an output signal indicating the resistive state of the memory element and thus indicating the data value stored in the memory cell. The output signal of the sense amplifier 410 is provided to checksum generator 430.

During the read process of the reference array 250, the checksum generator 430 computes a checksum 435 using the data values of the data set read from the memory cells of the reference array 250, and supplies the computed checksum 435 to comparator 440.

The checksum generator 430 may be implemented using special-purpose logic circuitry as known in the art. In alternative embodiments, the checksum generator 430 comprises a general-purpose processor, which may be implemented on the same integrated circuit to execute a computer program to control the operations of the device. In yet other embodiments, a combination of special-purpose logic circuitry and a general-purpose processor may be utilized for implementation of the checksum generator 430

The circuitry 224 also includes a register 400 storing a parameter 405 which represents the predetermined data set for the reference array, and provides this parameter 405 to the comparator 440 as part of the process described below. In the illustrated embodiment the parameter 405 is the expected checksum 405 which corresponds to the predetermined data set.

The comparator 440 compares the computed checksum 435 and the expected checksum 405, and generates a refresh command signal REFRESH CMD 450 if the computed checksum 435 and the expected checksum are different 405. The controller 234 is responsive to the refresh command signal REFRESH CMD 450 to then perform a refresh operation of the memory array 212 and the reference array 250.

Figure 5:
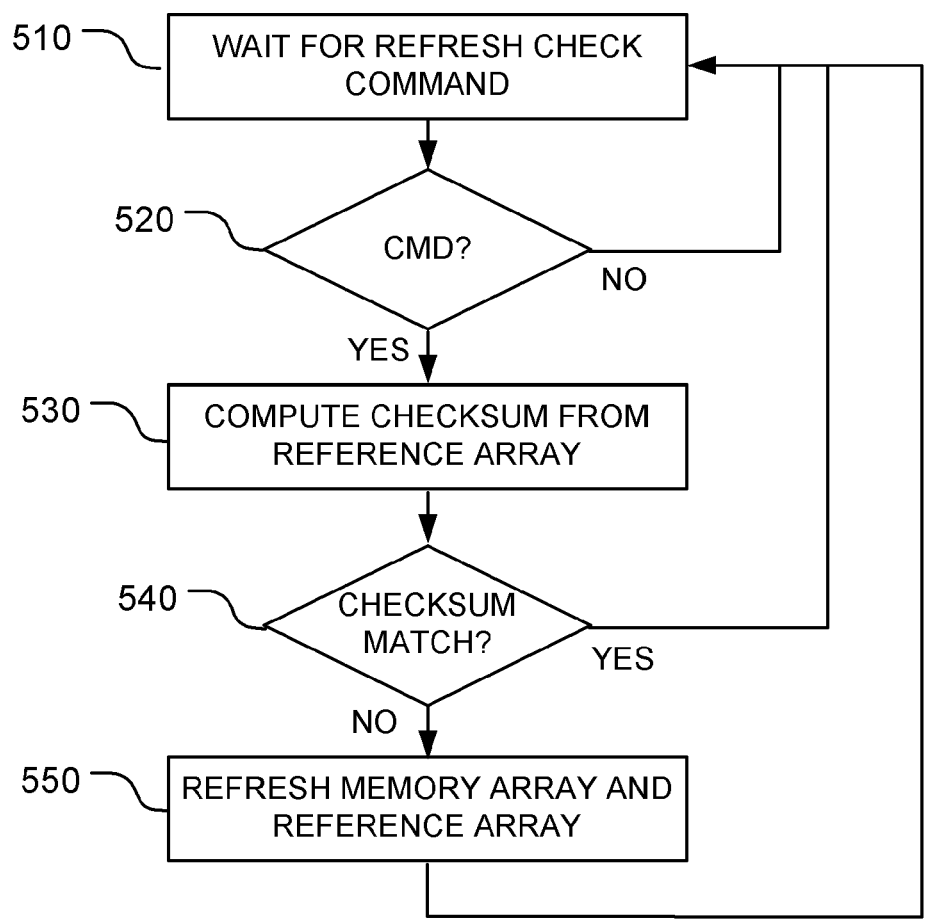
FIG. 5 is a embodiment of a process which can be executed by the controller using the circuitry of FIG. 4 to determine when to perform a refresh operation.

FIG. 5 is an embodiment of a process 500 which can be executed by the controller 234 using the circuitry 234 of FIG. 4 to determine when to perform a refresh operation of the memory array 212 and the reference array 250.

In FIG. 5, the process 500 is executed upon receiving a refresh check command. Until the refresh check command is received, the process loops in blocks 510 and 520.

Upon receiving the refresh check command (block 520), the controller 234 causes a read process of the data set stored in the reference array 250 using the sense amplifiers of block 410, and causes the computation of the checksum 435 from the stored data set by the checksum generator 430 of the sense circuitry 224 (block 530).

Next, the computed checksum 435 and the expected checksum 405 stored in the register 400 are compared by comparator 440 (block 540). If the expected checksum 405 and the computed checksum 435 match at block 540, then the data stored in reference array 250 is determined to correspond to the predetermined data set and a refresh operation is not required. The process 500 loops back to block 510 to await another refresh check command.

It the expected checksum 405 and the computed checksum 435 do not match at block 540, then the reference array 250 has bit errors and the comparator 440 generates the refresh command signal REFRESH CMD 450. The process 500 the continues to block 550.

At block 550, the controller 234 is responsive to the REFRESH CMD 450 to cause a refresh operation to be performed on the memory array 212 and the reference array 250. The controller 234 causes the application of appropriate read bias arrangements to read the resistance of the memory cells, and if necessary causes the application of appropriate bias arrangements to refresh the resistance of the corresponding memory elements to offset any change in resistance that may have occurred between refresh cycles.

Alternative techniques for determining bit errors in the reference array 250 may also be used. For example, in embodiments in which the reference array 250 stores a checkerboard pattern, bit errors may be determined by detecting consecutive memory cells having the same resistance state using logic circuitry.

Figure 6:
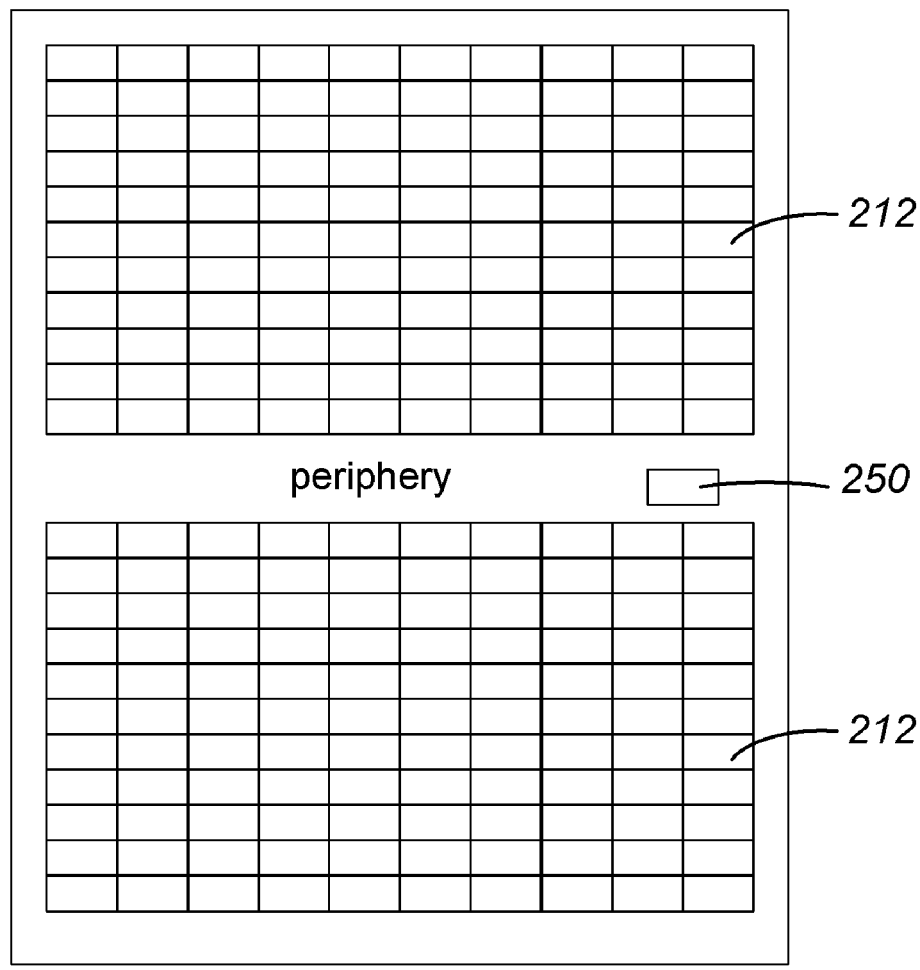
FIG. 6 is an example top view layout showing the relative sizes and locations of the reference array and memory array.

FIG. 6 is an example top view layout showing the relative sizes and locations of the reference array 250 and memory array 212. Alternatively, the relative sizes and locations of the arrays 250, 212 may be different.

Figure 7:
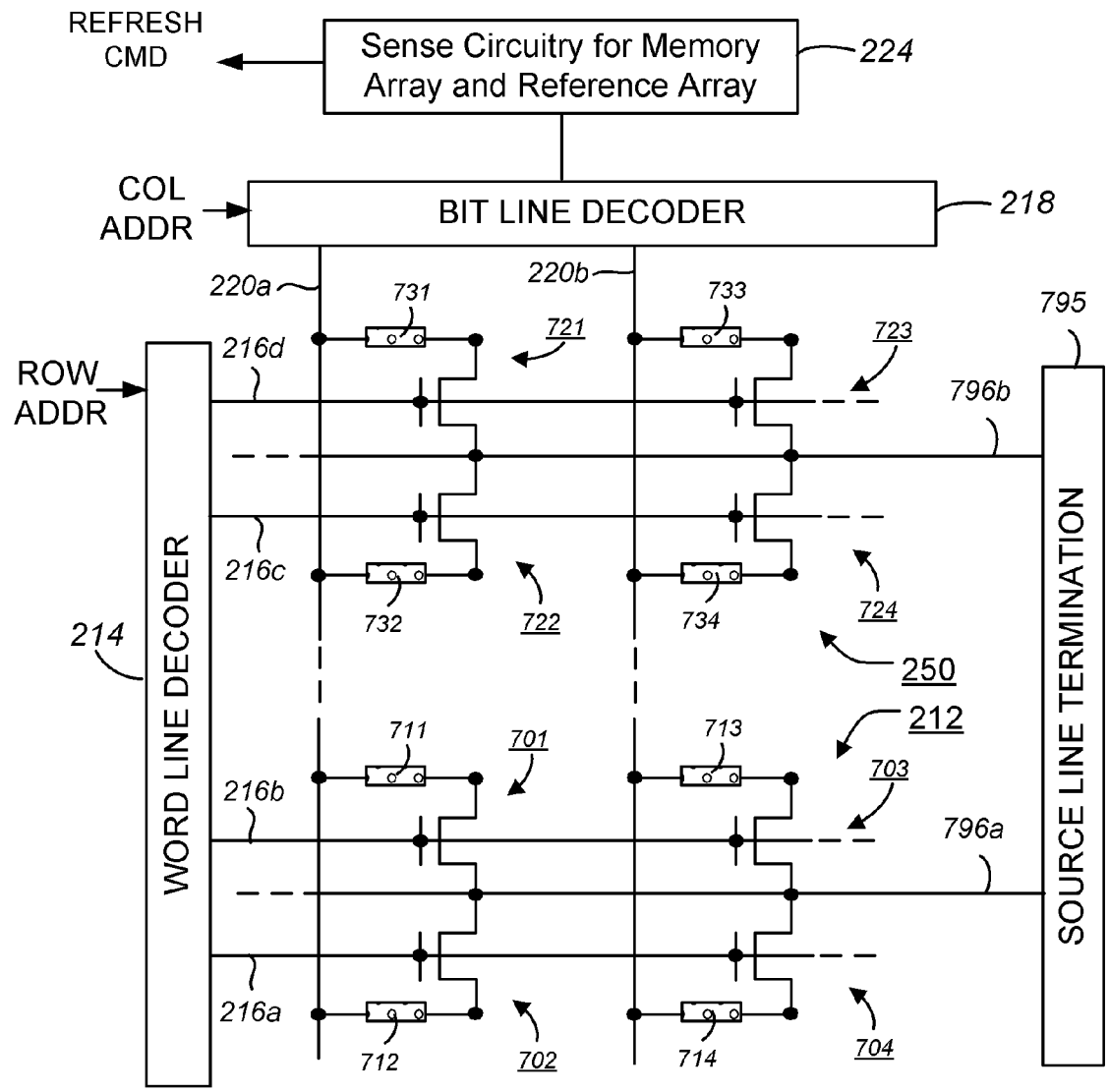
FIG. 7 illustrates a schematic diagram of an embodiment of a portion of respective memory cells in the memory array and the reference array.

FIG. 7 illustrates a schematic diagram of an embodiment of a portion of respective memory cells of the memory array 212 and the reference array 250. In the illustrated embodiment the memory array 212 and the reference array 250 share the bit lines 220. Alternatively, other configurations may be used, such as sharing the word lines 216.

The memory array 212 includes memory cells 701, 702, 703, 704 having respective memory elements 711, 712, 713, 714. The reference array 250 includes memory cells 721, 722, 723, 724 having respective memory elements 721, 722, 723, 724.

The arrays 212, 250 include a plurality of word lines 216 including word lines 216a, 216b, 216c, 216d extending in parallel in a first direction, and a plurality of bit lines 220 including bit lines 220a, 220b extending in parallel in a second direction perpendicular to the first direction.

Sources of each of the four access transistors illustrated in the memory array 212 are connected in common to source line 796a that terminates in a source line termination circuit 795, such as a ground terminal. In another embodiment the sources of the access devices are not electrically connects, but independently controllable.

Sources of each of the four access transistors illustrated in the reference array 250 are connected in common to source line 796b that terminates in a source line termination circuit 795.

The source line termination circuit 795 may include bias circuits such as voltage and current sources, and decoding circuits for applying bias arrangements other than ground to the source lines 796 in some embodiments.

Reading or writing to the memory cells of the arrays 212, 250 can be achieved by applying appropriate bias arrangements discussed above. The memory cells of the arrays 212, 250 are distinguished by their address to determine the characteristics of the signals sent by the controller 234 to couple the bias circuitry to apply pulses to operate the memory cells of the arrays 212, 250.

To achieve the different high resistance states 302 and 312 for the memory array 212 and reference array 250, the active regions of the phase change memory elements of the memory cells of the reference array 250 have a different mixture of crystalline and amorphous phase material, or a smaller active region, than phase change memory elements of the memory cells of the memory array 212 in the reset state 302.

For example, to achieve the different high resistance states 302 and 312 for the memory array 212 and reference array 250, in a reset operation of a memory cell in the memory array 212 a first reset pulse may be applied, and in a reset operation of a memory cell in the reference array 250 a second reset pulse may be applied, the first and second reset pulses having different values for at least one of pulse width, pulse height, and shape of the trailing edge of the pulse.

Alternatively, reset pulses having the same pulse shapes may be applied to both the memory array 212 and reference array 250, and the different distributions 302 and 312 for the reset and set states may be achieved by differences in the cell structures of the arrays 212, 250, such as providing features in the cells to obtain different amounts of current density and thus resulting in differences in resistance.

The predetermined data set stored in the reference array 250 in the illustrated embodiment is a checkerboard pattern of alternating high and low resistance states between adjacent memory cells in the reference array 250. Thus, in the illustrated embodiment the memory elements 731, 734 are programmed to the set state 310, and the memory elements 732, 733 are programmed to the partial reset state 312.

It will be understood that the memory array 212 and reference array 250 are not limited to the array configuration illustrated in FIG. 7, and other array configurations can also be used including implementing different configurations for each of the arrays 212 and 250.

In the illustrated embodiment of FIG. 7, the memory array 212 and reference array 250 include field effect transistor access devices. Alternatively, other access devices such as diodes or bipolar junction transistors may be used, including using different types of access devices for the two arrays 212, 250.

In the embodiments described above, the reference array 250 and the memory array 212 are arranged at different locations within a single memory array to share common control circuitry and bias circuitry. Alternatively, the reference array 250 and the memory array 212 may be arranged in separate arrays, and may also each have separate control circuitry and bias circuitry.

In some embodiments the memory cells of the reference array 250 and the memory cells of the memory array 212 have memory elements with the same physical configuration. Alternatively, the memory cells of the arrays 250, 212 may comprise various types of memory elements having different physical configurations.

FIGS. 8A-8E show representative prior art memory cell structures which may be implemented in the memory cells of the arrays 250, 212.

Figure 8A:
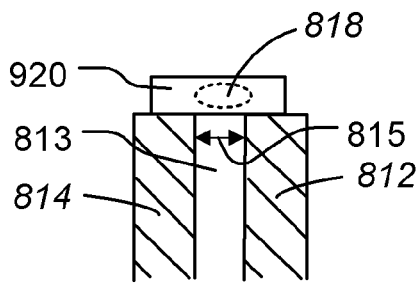
FIGS. 8A-8E show representative prior art memory cell configurations which may be implemented in the memory cells of the memory array and reference array.

FIG. 8A is a simplified cross-sectional view illustrating a first configuration for memory element 820 coupled to first and second electrodes 812, 814. The first electrode 812 may, for example, be coupled to a terminal of an access device such as a diode or transistor, while the second electrode 814 may be coupled to a bit line.

A dielectric spacer 813 having a width 815 separates the first and second electrodes 812, 814. The phase change material of memory element 920 extends across the dielectric spacer 813 and contacts the first and second electrodes 812, 814, thereby defining an inter-electrode path between the first and second electrodes 812, 814 having a path length defined by the width 815 of the dielectric spacer 813. In operation, as current passes between the first and second electrodes 812, 814 and through the memory element 920, the active region 818 of the phase change material of the memory element 920 heats up more quickly than the remainder of the memory element 920.

Figure 8B:
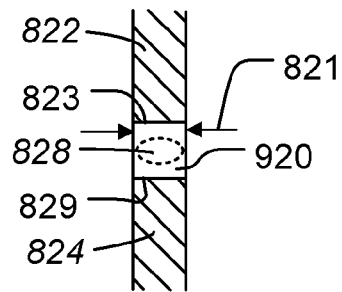

FIG. 8B is a simplified cross-sectional view illustrating a second configuration for memory element 920 coupled to first and second electrodes 822, 824. The phase change material of the memory element 920 has an active region 828 and contacts the first and second electrodes 822, 824 at top and bottom surfaces 823, 829 respectively. The memory element 920 has a width 821 the same as that of the first and second electrodes 822, 824.

Figure 8C:
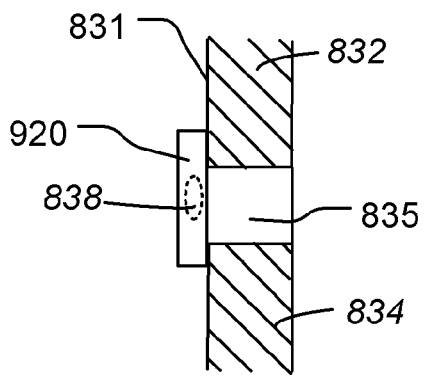

FIG. 8C is a simplified cross-sectional view illustrating a third configuration for memory element 920 coupled to first and second electrodes 832, 834, the phase change material of memory element 920 having an active region 838. The first and second electrodes 832, 834 are separated by dielectric spacer 835. The first and second electrodes 832, 834 and the dielectric spacer 835 have a sidewall surface 831. The phase change material of memory element 920 is on the sidewall surface 831 and extends across the dielectric spacer 835 to contact the first and second electrodes 832, 834.

Figure 8D:
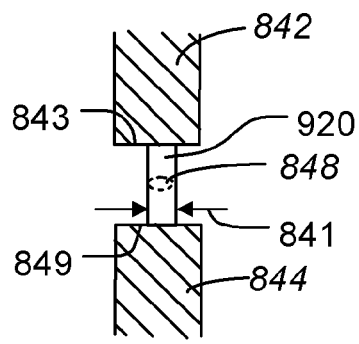

FIG. 8D is a simplified cross-sectional view illustrating a fourth configuration for memory element 920 coupled to first and second electrodes 842, 844. The phase change material of memory element 920 has an active region 848 and contacts the first and second electrodes 842, 844 at top and bottom surfaces 843, 849 respectively. The memory element 920 has a width 841 less than that of the first and second electrodes 842, 844.

Figure 8E:
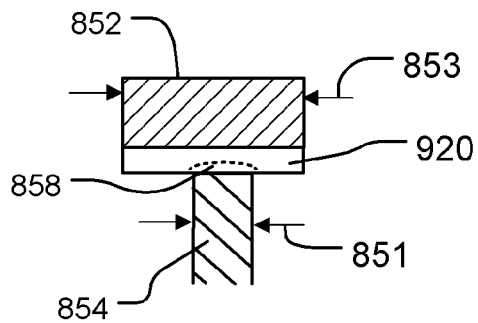

FIG. 8E is a simplified cross-sectional view illustrating a fifth configuration for memory element 920 coupled to first and second electrodes 854, 852. The first electrode 854 has a width 851 less than width 853 of the second electrode 852 and memory element 920. Because of the difference between width 851 and width 853, in operation the current density in the phase change material of memory element 920 is largest in the region adjacent the first electrode 854, resulting in the active region 858 having a "mushroom" shape as shown in the Figure.

Embodiments of the memory cells described herein include phase change based memory materials, including chalcogenide based materials and other materials, for the programmable resistance memory elements. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112, cols. 10-11.) Particular alloys evaluated by another researcher include $Ge_2Sb_2Te_5$, $GeSb_2Te_4$ and $GeSb_4Te_7$ (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including other materials that use different crystal phase changes to determine resistance, or other memory materials that use an electrical pulse to change the resistance state. Examples include materials for use in resistance random access memory (RRAM) such as metal-oxides including tungsten-oxide ($WO_x$), NiO, $Nb_2O_5$, $CuO_2$, $Ta_2O_5$, $Al_2O_3$, CoO, $Fe_2O_3$, $HfO_2$, $TiO_2$, $SrTiO_3$, $SrZrO_3$, $(BaSr)TiO_3$. Additional examples include materials for use in magnetoresistance random access memory (MRAM) such as spin-torque-transfer (STT) MRAM, for example at least one of CoFeB, Fe, Co, Ni, Gd, Dy, CoFe, NiFe, MnAs, MnBi, MnSb, $CrO_2$, $MnOFe_2O_3$, $FeOFe_2O_5$, $NiOFe_2O_3$, $MgOFe_2$, EuO, and $Y_3Fe_5O_{12}$. See, for example, US Publication No 2007/0176251 entitled "Magnetic Memory Device and Method of Fabricating the Same", which is incorporated by reference herein. Additional examples include solid electrolyte materials used for programmable-metallization-cell (PMC) memory, or nano-ionic memory, such as silver-doped germanium sulfide electrolytes and copper-doped germanium sulfide electrolytes. See, for example, N. E. Gilbert et al., "A macro model of programmable metallization cell devices," Solid-State Electronics 49 (2005) 1813-1819, which is incorporated by reference herein.

An exemplary method for forming chalcogenide material uses PVD-sputtering or magnetron-sputtering method with source gas(es) of Ar, $N^2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously. An exemplary method for forming chalcogenide material using chemical vapor deposition (CVD) is disclosed in US Publication No 2006/0172067 entitled "Chemical Vapor Deposition of Chalcogenide Materials", which is incorporated by reference herein. Another exemplary method for forming chalcogenide material using CVD is disclosed in Lee, et al., "Highly Scalable Phase Change Memory with CVD GeSbTe for Sub 50 nm Generation, 2007 Symposium on VLSI Technology Digest of Technical Papers, pp. 102-103.

A post-deposition annealing treatment in a vacuum or in an N2 ambient is optionally performed to improve the crystallize state of chalcogenide material. The annealing temperature typically ranges from 100° C. to 400° C. with an anneal time of less than 30 minutes.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device comprising:
   a memory array of phase change memory cells;
   a reference array of phase change memory cells;
   bias circuitry to establish low and high resistance states in the memory array and in the reference array, the high resistance state for the reference array having a minimum resistance less than that of the high resistance state for the memory array;
   sense circuitry to read the reference array and to generate a refresh command signal if there is a difference between a current data set stored in the reference array and an expected data set; and
   control circuitry responsive to the refresh command signal to perform a refresh operation on the memory array.

2. The device of claim 1, wherein the refresh operation includes a refresh operation on the reference array.

3. The device of claim 1, further comprising memory adapted to store a first checksum corresponding to the expected data set, and wherein the sense circuitry includes logic to compute a second checksum using the current data set, and to compare the first and second checksums to generate the refresh command signal.

4. The device of claim 1, wherein the expected data set stored in the reference array is a checkerboard pattern of alternating high and low resistance states among adjacent memory cells in the reference array.

5. The device of claim 1, wherein memory cells in the reference array and memory cells in the memory array respectively comprise phase change memory elements having different physical configurations.

6. The device of claim 1, wherein memory cells in the reference array and memory cells in the memory array respectively comprise phase change memory elements having the same physical configurations.

7. The device of claim 1, wherein the bias circuitry is adapted to apply a first pulse to a memory cell in the reference array to establish the high resistance state of the reference array, and adapted to apply a second pulse to a memory cell in the memory array to establish the high resistance state of the memory array, the first and second pulses having different values for at least one of pulse width and pulse height.

8. The device of claim 1, wherein the low resistance states of the reference array and the memory array correspond to the same resistance range.

9. The device of claim 1, wherein memory cells in the reference array have a smaller active region than that of memory cells in the memory array.

10. The device of claim 1, wherein the reference array includes 100 or more memory cells.

11. A method for operating a memory device comprising a memory array of phase change memory cells and a reference array of phase change memory cells, the method comprising:
 storing low and high resistance states in the memory array and in the reference array, the high resistance state for the reference array having a minimum resistance less than that of the high resistance state for the memory array;
 reading the reference array;
 determining a difference between a current data set stored in the reference array and an expected data set; and
 upon determination of the difference, performing a refresh operation on the memory array.

12. The method of claim 11, wherein said performing includes performing a refresh operation on the reference array.

13. The method of claim 11, wherein said determining includes:
 computing a checksum using the current data set; and
 comparing the checksum and an expected checksum to determine a difference.

14. The method of claim 11, wherein the expected data set stored in the reference array is a checkerboard pattern of alternating high and low resistance states among adjacent memory cells in the reference array.

15. The method of claim 11, wherein memory cells in the reference array and memory cells in the memory array respectively comprise phase change memory elements having different physical configurations.

16. The method of claim 11, wherein memory cells in the reference array and memory cells in the memory array respectively comprise phase change memory elements having the same physical configuration.

17. The method of claim 11, wherein said storing includes:
 applying a first pulse to a memory cell in the reference array to establish the high resistance state of the reference array; and
 applying a second pulse to a memory cell in the memory array to establish the high resistance state of the memory array, the first and second pulses having different values for at least one of pulse width and pulse height.

18. The method of claim 11, wherein the low resistance states of the reference array and the memory array correspond to the same resistance range.

19. The method of claim 11, wherein memory cells in the reference array have a smaller active region than that of memory cells in the memory array.

20. The method of claim 11, wherein the reference array includes 100 or more memory cells.

* * * * *